(12) United States Patent
Cheng (10) Patent No.: US 9,800,002 B2
(45) Date of Patent: Oct. 24, 2017

(54) ELECTRONIC DEVICE WITH PLUG

(71) Applicant: Ching-Chi Cheng, Taoyuan (TW)

(72) Inventor: Ching-Chi Cheng, Taoyuan (TW)

( * ) Notice: Subject to any disclaimer, the term of this patent is extended or adjusted under 35 U.S.C. 154(b) by 0 days.

(21) Appl. No.: 15/220,215

(22) Filed: Jul. 26, 2016

(65) Prior Publication Data

US 2017/0040763 A1    Feb. 9, 2017

(30) Foreign Application Priority Data

Aug. 3, 2015 (TW) .............................. 104125150 A (51) Int. Cl.
| | | |
|---|---|---|
| *H01R 25/00* | (2006.01) | |
| *H01R 24/68* | (2011.01) | |
| *H01R 12/70* | (2011.01) | |
| *H01R 13/04* | (2006.01) | |
| *H01R 13/11* | (2006.01) | |
| *H01R 31/06* | (2006.01) | |
| *H01R 12/71* | (2011.01) | |
| *H01R 103/00* | (2006.01) | |
| *H05K 1/11* | (2006.01) | |

(52) U.S. Cl.
CPC ......... *H01R 24/68* (2013.01); *H01R 12/7088* (2013.01); *H01R 13/04* (2013.01); *H01R 13/113* (2013.01); *H01R 31/06* (2013.01); *H01R 12/716* (2013.01); *H01R 2103/00* (2013.01); *H05K 1/117* (2013.01); *H05K 2201/10189* (2013.01); *H05K 2201/10318* (2013.01)

(58) Field of Classification Search
CPC .... H01R 13/6658; H01R 27/00; H01R 31/02; H01R 13/652; H01R 29/00; H01R 31/06; H01R 25/006; H01R 23/725

USPC ....... 439/76.1, 103, 105–106, 170–172, 218, 439/221, 638, 650–652, 78
See application file for complete search history.

(56) References Cited

U.S. PATENT DOCUMENTS 5,106,317 A * 4/1992 Taylor .................... H01R 31/06
439/173
5,409,397 A * 4/1995 Karman ................ H01R 31/06
439/105

(Continued)

FOREIGN PATENT DOCUMENTS

| CN | 102214883 A | 10/2011 |
| CN | 103036107 A | 4/2013 |

*Primary Examiner* — Thanh Tam Le
(74) *Attorney, Agent, or Firm* — Kirton McConkie; Evan R. Witt (57) ABSTRACT

An electronic device with a plug includes a casing, a connection member and a circuit board. The connection member is combined with the casing. The connection member includes a first surface, a second surface, at least two perforations and at least two insertion parts. The first surface and the second surface are opposed to each other. The at least two perforations run through the first surface and the second surface. The at least two insertion parts are fixed on the first surface, protruded externally from the first surface and aligned with the corresponding perforations. The circuit board is accommodated within an accommodation space of the casing, and includes at least two conducting terminals. The conducting terminals are penetrated through the corresponding perforations from the second surface of the connection member, received within the corresponding insertion parts and partially protruded out of the corresponding insertion parts.

9 Claims, 7 Drawing Sheets

(56) References Cited

U.S. PATENT DOCUMENTS

| | | | | |
|---|---|---|---|---|
| 7,465,176 B2* | 12/2008 | Liao | ................ | H01R 27/00 |
| | | | | 439/172 |
| 7,794,251 B2* | 9/2010 | Wen | ................ | H01R 13/514 |
| | | | | 320/111 |
| 8,052,441 B2* | 11/2011 | Senatori | ............ | H01R 13/6675 |
| | | | | 439/171 |
| 8,267,705 B2* | 9/2012 | Huang | ............... | H01R 27/00 |
| | | | | 439/171 |
| 8,608,489 B2* | 12/2013 | Nogami | ............ | H01R 13/6658 |
| | | | | 439/377 |

* cited by examiner

ELECTRONIC DEVICE WITH PLUG

FIELD OF THE INVENTION

The present invention relates to an electronic device, and more particularly to an electronic device with a plug.

BACKGROUND OF THE INVENTION

With increasing development of science and technology, various electronic devices become essential devices in our daily lives. Generally, the electronic device is equipped with a circuit board. The circuit board is electrically connected with an external power source in order to acquire electric energy for powering electronic components of the circuit board. Conventionally, the circuit board and the external power source are connected with each other by inserting a plug of the electronic device into a socket of the external power source (e.g., a utility power source).

Figure 1:
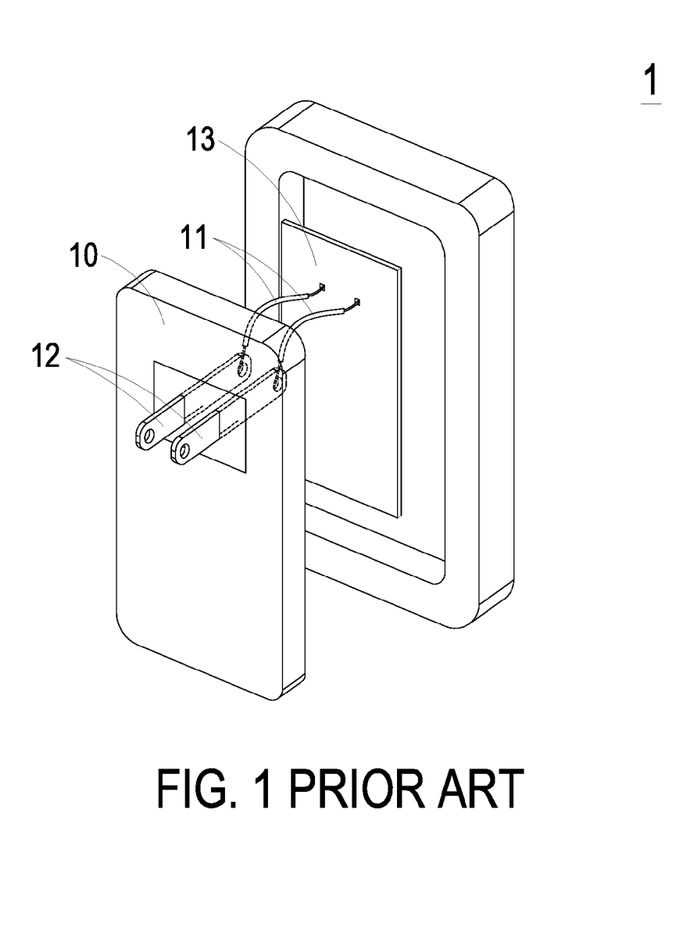
FIG. 1 schematically illustrates the connection between a plug and a circuit board of an electronic device through jumper wires.

Conventionally, the plug of the electronic device and the inner circuit board are electrically connected with each other through jumper wires. FIG. 1 schematically illustrates the connection between a plug and a circuit board of an electronic device through jumper wires. A first end of the jumper wire 11 is welded on an end of a conducting terminal 12 of the plug 10. A second end of the jumper wire 11 is welded on a solder point of the circuit board 13. As known, the uses of the jumper wires 11 increase the fabricating cost and increase the complexity of assembling the electronic device 1. Moreover, since the impedance is increased, the power loss in transmission is increased.

Therefore, there is a need of providing an improved electronic device with a plug in order to overcome the above drawbacks.

SUMMARY OF THE INVENTION

An object of the present invention provides an electronic device with a plug. The electronic device has a simplified structure and is easily assembled. The process of fabricating the electronic device is time-saving, and thus the fabricating cost is reduced. Moreover, since the impedance is decreased, the power loss in transmission is reduced.

In accordance with an aspect of the present invention, there is provided an electronic device with a plug. The electronic device includes a casing, a connection member and a circuit board. The casing has an accommodation space. The connection member is combined with the casing. The connection member includes a first surface, a second surface, at least two perforations and at least two insertion parts. The first surface and the second surface are opposed to each other. The at least two perforations run through the first surface and the second surface. The at least two insertion parts are fixed on the first surface, protruded externally from the first surface and aligned with the corresponding perforations. The circuit board is accommodated within the accommodation space, and includes at least two conducting terminals. The conducting terminals are penetrated through the corresponding perforations from the second surface of the connection member, received within the corresponding insertion parts and partially protruded out of the corresponding insertion parts.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
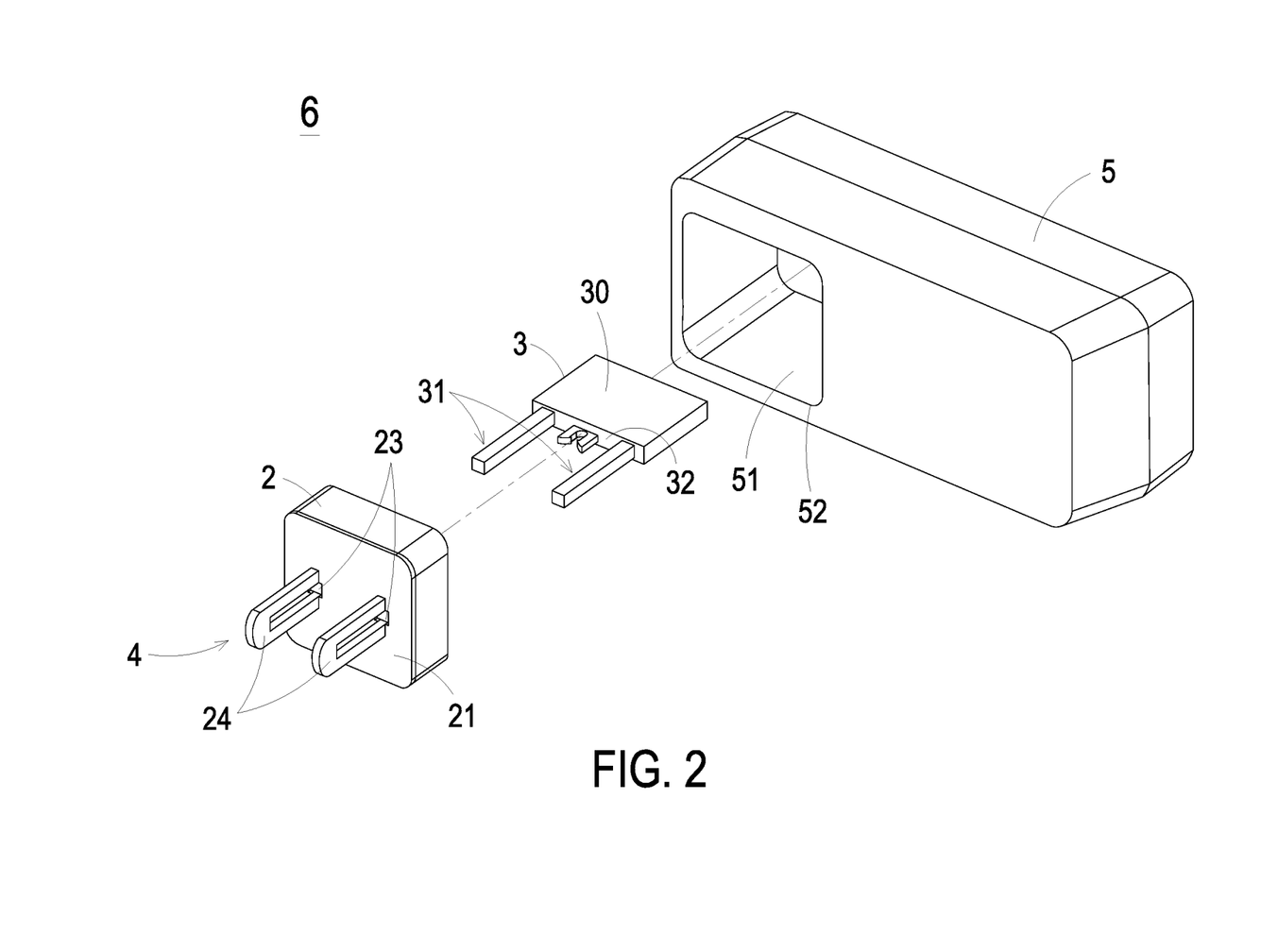
FIG. 2 is a schematic exploded view illustrating an electronic with a plug according to an embodiment of the present invention.
Figure 3A:
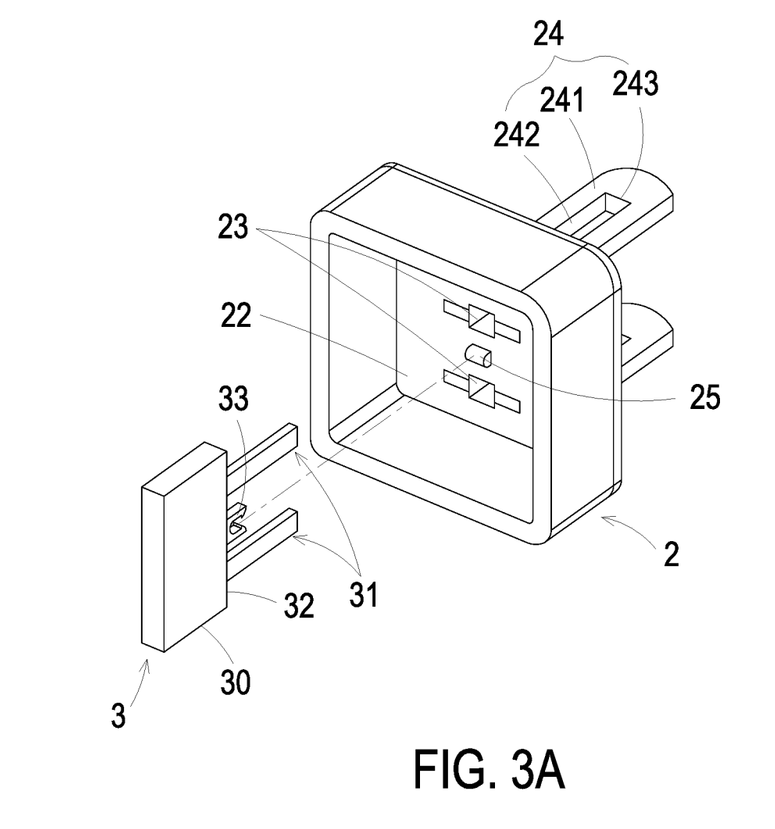
FIG. 3A is a schematic exploded view illustrating the relationship between the circuit board and the connection member of the electronic device of FIG. 2.
Figure 3B:
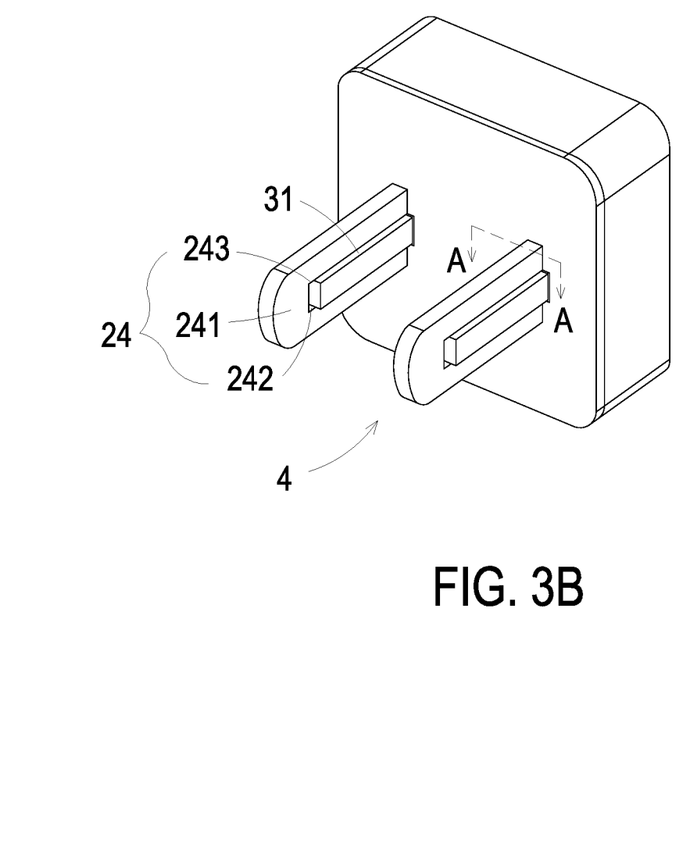
FIG. 3B is a schematic perspective view illustrating the combination the circuit board and the connection member of the electronic device of FIG. 2.

FIG. 2 is a schematic exploded view illustrating an electronic with a plug according to an embodiment of the present invention. FIG. 3A is a schematic exploded view illustrating the relationship between the circuit board and the connection member of the electronic device of FIG. 2. FIG. 3B is a schematic perspective view illustrating the combination the circuit board and the connection member of the electronic device of FIG. 2.

Please refer to FIGS. 2, 3A and 3B. The electronic device 6 comprises a casing 5, a connection member 2 and a circuit board 3. The casing 5 comprises an accommodation space 51 and an entrance 52. The circuit board 3 is accommodated within the accommodation space 51. When the connection member 2 is combined with the casing 5, the entrance 52 of the casing 5 is sheltered by the connection member 2. The connection member 2 comprises a first surface 21, a second surface 22, at least two perforations 23 and at least two insertion parts 24. The first surface 21 and the second surface 22 are opposed to each other. The at least two perforations 23 run through the first surface 21 and the second surface 22. The at least two insertion parts 24 are fixed on the first surface 21, protruded externally from the first surface 21, and aligned with the corresponding perforations 23. Moreover, each insertion part 24 comprises a flat plate 241 and an elongated slot 242. The elongated slot 242 is formed in the flat plate 241, and aligned with the corresponding perforation 23. Moreover, two slot openings 243 are located at two opposed sides of the flat plate 241. The circuit board 3 comprises a main body 30 and at least two conducting terminals 31. The at least two conducting terminals 31 are connected with a lateral side 32 of the main body 30 and protruded externally from the lateral side of the main body 30.

The conducting terminals 31 of the circuit board 3 are penetrated through the corresponding perforations 23 from the second surface 22 to the first surface 21 of the connection member 2, and received within the corresponding elongated slots 242 of the insertion parts 24. Moreover, the conducting terminals 31 are partially protruded out of the corresponding slot openings 243 of the insertion parts 24. In this embodiment, the conducting terminals 31 of the circuit board 3 and the connection member 2 are collaboratively defined as a plug 4. When the plug 4 is inserted into a socket (not shown) of an external power source, the conducting terminals 31 of the circuit board 3 are directly contacted with corresponding conductive slices (not shown) of the socket, the electronic device 6 can receive electric power from the external power source. Especially, it is not necessary to use the jumper wires.

In this embodiment, the connection member 2 is made of insulation material. Moreover, the insertion parts 24 are integrally formed with the connection member 2. Alternatively, in another embodiment, the insertion parts 24 are fixed on the first surface of the connection member 2 by an ultrasonic welding process. The insertion parts 24 are used for fixing and protecting the conducting terminals 31 of the circuit board 3. Moreover, because of the insertion parts 24, the possibility of causing deformation or breakage of the conducting terminals 31 are minimized even if the conducting terminals 31 are frequently inserted into or detached from the socket. Moreover, the insertion parts 24 can guide the conducting terminals 31 to be directly contacted with the conductive slices of the socket. The conducting terminals 31 of the circuit board 3 are separated from each other, and protruded externally from the lateral side 32 of the main body 30 of the circuit board 3. Moreover, the conducting terminals 31 are in parallel with each other. Correspondingly, the insertion parts 24 of the connection member 2 are separated from each other and in parallel with each other.

Figure 3C:
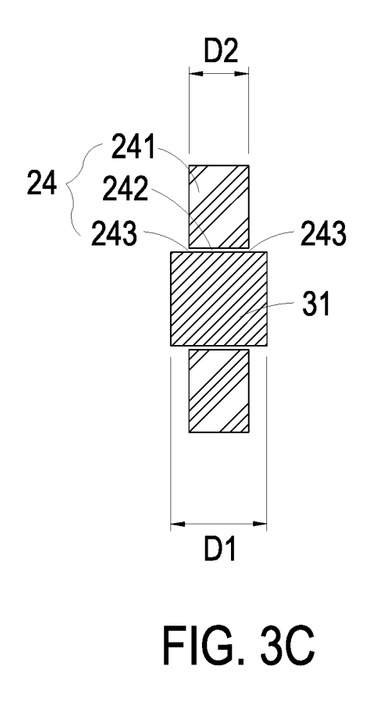
FIG. 3C is a schematic cross-sectional view illustrating the connection member of FIG. 3B and taken along the line AA.

FIG. 3C is a schematic cross-sectional view illustrating the connection member of FIG. 3B and taken along the line AA. As shown in FIG. 3C, the conducting terminals 31 of the circuit board 3 are received within the corresponding elongated slots 242 of the insertion parts 24. Moreover, each conducting terminal 31 is partially protruded out of at least one slot opening 243 of the corresponding insertion part 24. More preferably, each conducting terminal 31 is partially protruded out of two slot openings 243 of the corresponding insertion part 24. The conducting terminal 31 of the circuit board 3 has a width D1, and the flat plate 241 of the insertion part 24 has a thickness D2, wherein the width D1 is larger than the thickness D2.

Please refer to FIGS. 2, 3A and 3B. The connection member 2 further comprises a first engaging part 25, and the circuit board 3 further comprises a second engaging part 33. The first engaging part 25 is disposed on the second surface 22 of the connection member 2. The second engaging part 33 is disposed on the lateral side 32 of the main body 30 of the circuit board 3. Due to the engagement between the first engaging part 25 of the connection member 2 and the second engaging part 33 of the circuit board 3, the connection member 2 and the circuit board 3 are securely combined together. Consequently, the conducting terminals 31 of the circuit board 3 are received within the corresponding elongated slots 242 of the insertion parts 24 more securely. Preferably but not exclusively, the first engaging part 25 is integrally formed with the connection member 2, and the second engaging part 33 is integrally formed with the circuit board 3. In an embodiment, the first engaging part 25 is arranged between the at least two perforations 23, and the second engaging part 33 is arranged between the at least two conducting terminals 31. In an embodiment, the first engaging part 25 is a bulge, and the second engaging part 33 comprises two resilient clamp arms. It is noted that the structures and positions of the first engaging part 25 and the second engaging part 33 may be varied according to the practical requirements.

Figure 4:
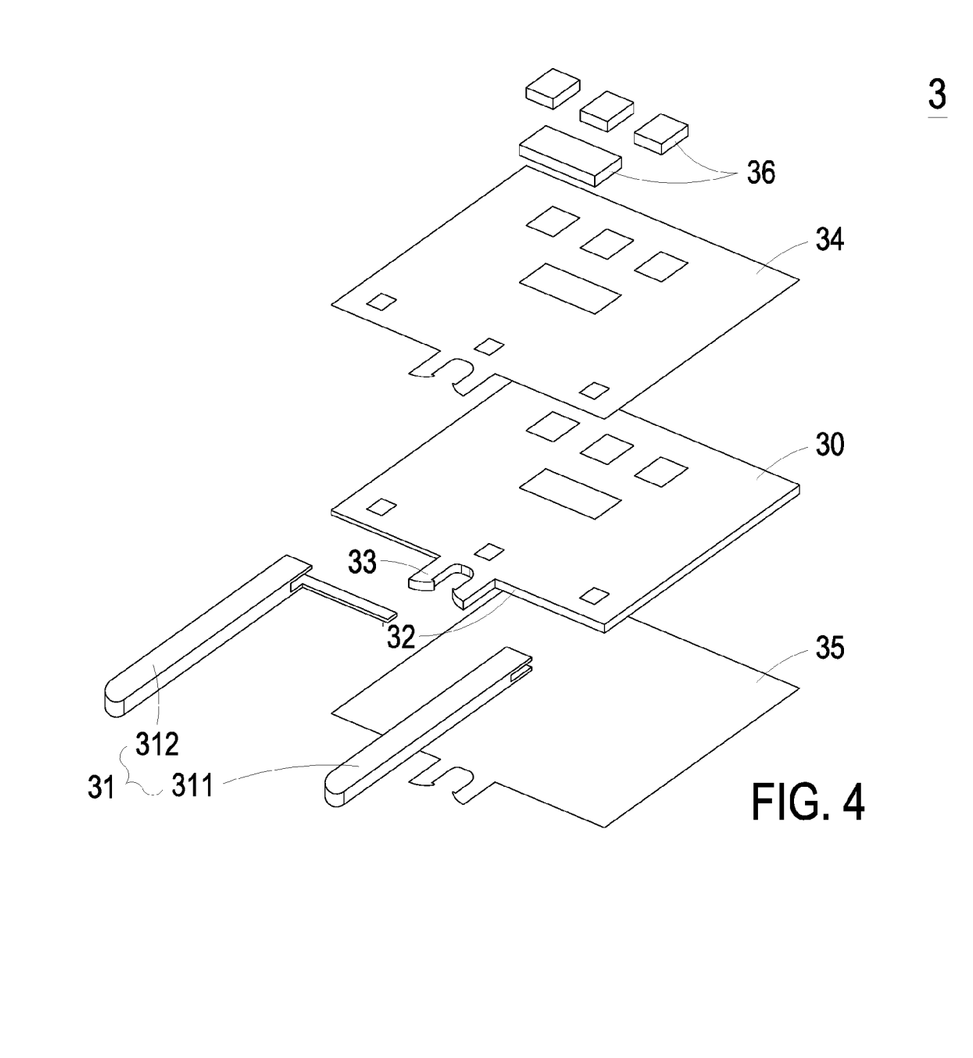
FIG. 4 is a schematic exploded view illustrating the circuit board of the electronic device according to the embodiment of the present invention.

FIG. 4 is a schematic exploded view illustrating the circuit board of the electronic device according to the embodiment of the present invention. As shown in FIG. 4, the circuit board 3 comprises a main body 30, a first conducting terminal 311, a second conducting terminal 312, a first insulation film 34, a second insulation film 35 and at least one electronic component 36. The main body 30 is a single-layered wiring structure or a multi-layered wiring structure. Moreover, the main body 30 is a rigid wiring structure. A first end of the first conducting terminal 311 and a first end of the second conducting terminal 312 are connected with the lateral side 32 of the main body 30. In some other embodiments, the first end of the first conducting terminal 311 and the first end of the second conducting terminal 312 have clamping structures (not shown). When the main body 30 of the circuit board 3 is clamped by the clamping structures, the first conducting terminal 311 and the second conducting terminal 312 are coupled with the main body 3 and contacted with corresponding contact points of the main body 30. Consequently, the first conducting terminal 311 and the second conducting terminal 312 are electrically connected with the main body 3. The first insulation film 34 and the second insulation film 35 are attached on two opposite sides of the main body 30. Preferably but not exclusively, the top surface and the bottom surface of the second engaging part 33 are covered by the first insulation film 34 and the second insulation film 35, respectively. The first insulation film 34 has plural hollow regions. The electronic components 36 are penetrated through the hollow regions of first insulation film 34 and welded on the main body 30. It is noted that the structure of the circuit board 3 and the structures for connecting the main body 30 and the conducting terminals 31 may be varied according to the practical requirements.

Figure 5:
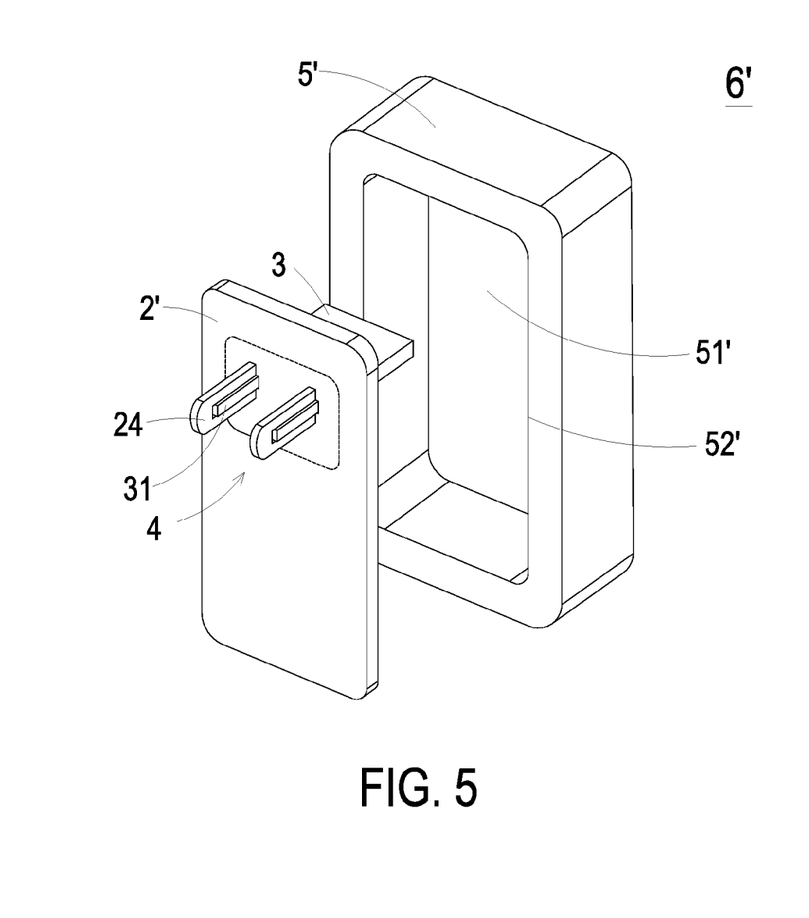
FIG. 5 is a schematic exploded view illustrating an electronic device with a plug according to another embodiment of the present invention.

FIG. 5 is a schematic exploded view illustrating an electronic device with a plug according to another embodiment of the present invention. Component parts and elements corresponding to those of FIG. 2 are designated by identical numeral references, and detailed descriptions thereof are omitted. In this embodiment, the connection member 2' of the electronic device 6' is substantially a cover plate. When the connection member 2' is combined with the casing 5', the entrance 52' of the casing 5' is sheltered by the connection member 2'. Moreover, the casing 5' is made of a light-transmissible material, and one of the electronic components of the circuit board 3 is a solid-state light-emitting element such as a light emitting diode. Under this circumstance, the electronic device 6' is used as a small-size lamp or a night light. It is noted that the profile of the plug 4 is not restricted. In some other embodiments, the insertion parts 24 are not in parallel with each other, and the conducting terminals 31 are not in parallel with each other. Consequently, the plug 4 is designed to comply with the regulations of different countries. An example of the electronic device 6' includes but is not limited to a power converter, a charger, a power connector, a small-sized lamp, a night light, an electronic insecticidal machine or a wall-hung electronic device.

From the above descriptions, the present invention provides an electronic device with a plug. The electronic device has a simplified structure and is easily assembled. The process of fabricating the electronic device is time-saving, and thus the fabricating cost is reduced. Moreover, since the impedance is decreased, the power loss in transmission is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device with a plug, the electronic device comprising:
    a casing having an accommodation space;
    a connection member combined with the casing, wherein the connection member comprises a first surface, a second surface, at least two perforations and at least two insertion parts, wherein the first surface and the second surface are opposed to each other, the at least two perforations run through the first surface and the second surface, and the at least two insertion parts are fixed on the first surface, protruded externally from the first surface and aligned with the corresponding perforations; and
    a circuit board accommodated within the accommodation space, and comprising at least two conducting terminals, wherein the conducting terminals are penetrated through the corresponding perforations from the second surface of the connection member, received within the corresponding insertion parts and partially protruded out of the corresponding insertion parts;
    wherein the circuit board further comprises a main body, and the at least two conducting terminals are separated from each other, connected with a lateral side of the main body and protruded externally from the lateral side of the main body.

2. The electronic device according to claim 1, wherein the casing further comprises an entrance corresponding to the accommodation space, wherein when the connection member is combined with the casing, the entrance of the casing is sheltered by the connection member.

3. The electronic device according to claim 1, wherein each of the at least two insertion parts comprises a flat plate and an elongated slot, wherein the elongated slot formed in the corresponding flat plate and aligned with the corresponding perforation, and at least one slot opening is formed in at least one side of the flat plate, wherein the conducting terminal is protruded out of the corresponding slot opening.

4. The electronic device according to claim 3, wherein a width of the conducting terminal is larger than a thickness of the flat plate.

5. The electronic device according to claim 1, wherein the connection member further comprises a first engaging part, and the circuit board further comprises a second engaging part, wherein the first engaging part is disposed on the second surface of the connection member, the second engaging part is disposed on the lateral side of the main body of the circuit board, wherein the first engaging part and the second engaging part are engaged with each other, so that the connection member and the circuit board are combined together.

6. The electronic device according to claim 5, wherein the first engaging part is arranged between the at least two perforations, and the second engaging part is arranged between the at least two conducting terminals.

7. The electronic device according to claim 5, wherein the first engaging part is a bulge, and the second engaging part comprises two resilient clamp arms.

8. The electronic device according to claim 1, wherein the connection member is made of insulation material, and the at least two insertion parts are integrally formed with the connection member.

9. The electronic device according to claim 1, wherein the at least two conducting terminals of the circuit board and the connection member are collaboratively defined as the plug of the electronic device.

* * * * *